United States Patent
Wang (10) Patent No.: US 7,811,930 B2
(45) Date of Patent: Oct. 12, 2010

(54) MANUFACTURING METHOD OF DUAL DAMASCENE STRUCTURE

(75) Inventor: Chih-Jung Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/406,938

(22) Filed: Mar. 18, 2009

(65) Prior Publication Data

US 2009/0176378 A1 Jul. 9, 2009

Related U.S. Application Data

(63) Continuation of application No. 11/160,392, filed on Jun. 22, 2005, now Pat. No. 7,531,448.

(51) Int. Cl.
*H01L 21/4763* (2006.01)
(52) U.S. Cl. .................. 438/638; 438/597; 438/624; 438/626; 257/E21.495
(58) Field of Classification Search ........... 438/638, 438/624, 626; 257/E21.495
See application file for complete search history.

(56) References Cited

U.S. PATENT DOCUMENTS

| | | | | |
|---|---|---|---|---|
| 6,042,999 A * | 3/2000 | Lin et al. | ............... | 430/316 |
| 6,197,681 B1 * | 3/2001 | Liu et al. | ............... | 438/637 |
| 6,197,696 B1 * | 3/2001 | Aoi | ............... | 438/700 |
| 6,350,700 B1 * | 2/2002 | Schinella et al. | ............... | 438/723 |
| 6,376,366 B1 * | 4/2002 | Lin et al. | ............... | 438/637 |
| 6,506,680 B1 * | 1/2003 | Kim et al. | ............... | 438/692 |
| 6,638,871 B2 * | 10/2003 | Wang et al. | ............... | 438/694 |
| 6,797,633 B2 * | 9/2004 | Jiang et al. | ............... | 438/706 |
| 2002/0173079 A1 * | 11/2002 | Kaltalioglu | ............... | 438/118 |
| 2003/0008490 A1 * | 1/2003 | Xing et al. | ............... | 438/622 |
| 2005/0001323 A1 * | 1/2005 | Watanabe et al. | ............... | 257/758 |
| 2005/0161821 A1 * | 7/2005 | Lee et al. | ............... | 257/758 |

* cited by examiner

*Primary Examiner*—Charles D Garber
*Assistant Examiner*—Angel Roman
(74) *Attorney, Agent, or Firm*—Jianq Chyun IP Office (57) ABSTRACT

A manufacturing method of a dual damascene structure is provided. First, a first dielectric layer, a second dielectric layer, and a mask layer are formed. A first trench structure is formed in the mask layer. A via structure is formed in the mask layer, the second dielectric layer, and the first dielectric layer. A portion of the second dielectric layer is then removed, so as to transform the first trench structure into a second trench structure. Here, a bottom of the second trench structure exposes the first dielectric layer.

14 Claims, 7 Drawing Sheets

MANUFACTURING METHOD OF DUAL DAMASCENE STRUCTURE

CROSS-REFERENCE TO RELATED APPLICATION

This application is a continuation of and claims priority benefit of an application Ser. No. 11/160,392, filed on Jun. 22, 2005, now allowed. The entirety of the above-mentioned patent applications is hereby incorporated by reference herein and made a part of this specification.

BACKGROUND OF THE INVENTION

1. Field of the Invention

The present invention relates to a manufacturing method of a semiconductor device, and more particularly to a manufacturing method of a dual damascene structure.

2. Description of the Related Art

In the present semiconductor manufacturing process, copper has been widely used to make interconnection of integrated circuits due to its low resistance and its capability of preventing electromigration. Because it is not easy to etch copper, the metal dual damascene process has replaced the traditional process to manufacture copper lines.

As the semiconductor devices continue to be miniaturized, resistance-capacitance (RC) time delay among metal interconnection lines becomes an essential part for integrated circuits. For the present process, low dielectric constant materials and copper lines are used to enhance device performance. In addition, if the low dielectric constant porous material (with a dielectric constant lower than 2.2) is used, the RC time delay can be further prevented.

For the 0.18-µm semiconductor technology or other submicron technology, low dielectric constant materials have been widely used to reduce the RC time delay. Thermal stress, however, have great impact on low dielectric constant materials, especially for organic spin-on materials, such as silicon low-k (SILK™). On the other hand, since low dielectric constant materials formed by a chemical vapor deposition (CVD) method have better thermal conductivity than the materials formed by an organic spin-on method. Accordingly, how to integrate these two low dielectric constant materials to reduce the impact from thermal stress has become an important task in semiconductor manufacturing process.

SUMMARY OF THE INVENTION

Accordingly, the present invention is directed to a manufacturing method of a dual damascene structure, wherein a dielectric layer comprising a low dielectric constant material may be used to reduce the dielectric constant of the dielectric layer.

The present invention is also directed to a manufacturing method of a dual damascene structure, wherein low dielectric constant material layers with different dielectric constants may be integrated by using a stacked structure.

The present invention is also directed to a manufacturing method of a dual damascene structure for reducing the impact from thermal stress in the conventional process.

The present invention is also directed to a manufacturing method of a dual damascene structure for simplifying the process for forming the dual damascene structure and to reduce the manufacturing costs.

The present invention provides a manufacturing method of a dual damascene structure. A barrier layer, a first dielectric layer, a second dielectric layer, a cap layer, a metal-containing hard mask layer, a dielectric hard mask layer, a first bottom anti-reflection coating layer, and a first photoresist layer are sequentially formed over a substrate. The first photoresist layer is patterned to obtain a patterned first photoresist layer. The first bottom anti-reflection coating layer, the dielectric hard mask layer, the metal-containing hard mask layer, and the cap layer are etched by using the patterned first photoresist layer as a mask layer to obtain a first trench structure. Wherein, a bottom of the first trench structure exposes a surface of the cap layer. The patterned first photoresist layer and the first bottom anti-reflection coating layer are removed. A second bottom anti-reflection coating layer is formed to fill the first trench structure and to cover a surface of the dielectric hard mask layer. A second photoresist layer is formed over the second bottom anti-reflection coating layer. The second photoresist layer is patterned to obtain a patterned second photoresist layer. The second bottom anti-reflection coating layer, the dielectric hard mask layer, the metal-containing hard mask layer, the cap layer, the second dielectric layer, and the first dielectric layer are etched by using the patterned second photoresist layer as a mask layer to obtain a first via structure. Wherein, a bottom of the first via structure exposes a surface of the first dielectric layer. The patterned second photoresist layer, the second bottom anti-reflection coating layer, and the dielectric hard mask layer are removed. The first trench structure and the first via structure are etched to obtain a second trench structure and a second via structure. Wherein, a bottom of the second via structure exposes a surface of the substrate, and a bottom of the second trench structure exposes a surface of the first dielectric layer.

The present invention also provides another manufacturing method of a dual damascene structure. A barrier layer, a first dielectric layer, a second dielectric layer, a metal-containing hard mask layer, a dielectric hard mask layer, a first bottom anti-reflection coating layer, and a first photoresist layer are sequentially formed over a substrate. The first photoresist layer is patterned to obtain a patterned first photoresist layer. The first bottom anti-reflection coating layer, the dielectric hard mask layer, and the metal-containing hard mask layer are etched by using the patterned first photoresist layer as a mask layer to obtain a first trench structure. Wherein, a bottom of the first trench structure exposes a surface of the metal-containing hard mask layer. The patterned first photoresist layer and the first bottom anti-reflection coating layer are removed. A second bottom anti-reflection coating layer is formed to fill the first trench structure and to cover a surface of the dielectric hard mask layer. A second photoresist layer is formed over the second bottom anti-reflection coating layer. The second photoresist layer is patterned to obtain a patterned second photoresist layer. The second bottom anti-reflection coating layer, the dielectric hard mask layer, the metal-containing hard mask layer, the second dielectric layer, and the first dielectric layer are etched by using the patterned second photoresist layer as a mask layer to obtain a first via structure. Wherein, a bottom of the first via structure exposes a surface of the first dielectric layer. The patterned second photoresist layer, the second bottom anti-reflection coating layer, and the dielectric hard mask layer are removed. The first trench structure and the first via structure are etched to obtain a second trench structure and a second via structure. Wherein, a bottom of the second via structure exposes a surface of the substrate, and a bottom of the second trench structure exposes a surface of the first dielectric layer.

The present invention also provides a manufacturing method of a dual damascene structure. A barrier layer, a first dielectric layer, a second dielectric layer, a cap layer, a metal-containing hard mask layer, a first bottom anti-reflection coating layer, and a first photoresist layer are sequentially formed over a substrate. The first photoresist layer is patterned to obtain a patterned first photoresist layer. The first bottom anti-reflection coating layer, the metal-containing hard mask layer and the cap layer are etched by using the patterned first photoresist layer as a mask layer to obtain a first trench structure. Wherein, a bottom of the first trench structure exposes a surface of the cap layer. The patterned first photoresist layer and the first bottom anti-reflection coating layer are removed. A second bottom anti-reflection coating layer is formed to fill the first trench structure and to cover a surface of the metal-containing hard mask layer. A second photoresist layer is formed over the second bottom anti-reflection coating layer. The second photoresist layer is patterned to obtain a patterned second photoresist layer. The second bottom anti-reflection coating layer, the metal-containing hard mask layer, the cap layer, the second dielectric layer and the first dielectric layer are etched by using the patterned second photoresist layer as a mask layer to obtain a first via structure. Wherein, a bottom of the first via structure exposes a surface of the first dielectric layer. The patterned second photoresist layer and the second bottom anti-reflection coating layer are removed. The first trench structure and the first via structure are etched to obtain a second trench structure and a second via structure. Wherein, a bottom of the second via structure exposes a surface of the substrate, and a bottom of the second trench structure exposes a surface of the first dielectric layer.

The present invention also provides a manufacturing method of a dual damascene structure. A barrier layer, a first dielectric layer, a second dielectric layer, a metal-containing hard mask layer, a first bottom anti-reflection coating layer, and a first photoresist layer are sequentially formed over a substrate. The first photoresist layer is patterned to obtain a patterned first photoresist layer. The first bottom anti-reflection coating layer and the metal-containing hard mask layer are etched by using the patterned first photoresist layer as a mask layer to obtain a first trench structure. Wherein, a bottom of the first trench structure exposes a surface of the metal-containing hard mask layer. The patterned first photoresist layer and the first bottom anti-reflection coating layer are removed. A second bottom anti-reflection coating layer is formed to fill the first trench structure and to cover a surface of the metal-containing hard mask layer. A second photoresist layer is formed over the second bottom anti-reflection coating layer. The second photoresist layer is patterned to obtain a patterned second photoresist layer. The second bottom anti-reflection coating layer, the metal-containing hard mask layer, the second dielectric layer and the first dielectric layer are etched by using the patterned second photoresist layer as a mask to obtain a first via structure. Wherein, a bottom of the first via structure exposes a surface of the first dielectric layer. The patterned second photoresist layer and the second bottom anti-reflection coating layer are removed. The first trench structure and the first via structure are etched to obtain a second trench structure and a second via structure. Wherein, a bottom of the second via structure exposes a surface of the substrate, and a bottom of the second trench structure exposes a surface of the first dielectric layer.

According to an embodiment of the present invention, the dielectric constant of the first dielectric layer, for example, is higher than that of the second dielectric layer.

According to an embodiment of the present invention, the hardness of the first dielectric layer, for example, is higher than that of the second dielectric layer.

According to an embodiment of the present invention, the surface of the second trench structure adjacent to the second via structure is inclined, for example.

According to an embodiment of the present invention, the method further comprises forming a liner layer to cover a surface of the second trench structure, a surface of the second via structure and a surface of the metal-containing hard mask.

According to an embodiment of the present invention, the material of the liner layer can be, for example, tantalum or tantalum nitride.

According to an embodiment of the present invention, the method further comprises forming a metal layer over the liner layer, for example.

According to an embodiment of the present invention, the material of the metal layer can be, for example, copper.

According to an embodiment of the present invention, the method further comprises planarizing the surface of the dual damascene structure until exposing the surface of the cap layer, for example.

According to an embodiment of the present invention, the method further comprises planarizing the surface of the dual damascene structure until exposing the surface of the second dielectric layer, for example.

According to an embodiment of the present invention, the material of the barrier layer can be, for example, silicon nitride, silicon carbide or silicon carbonitride.

According to an embodiment of the present invention, the material of the first dielectric layer can be, for example, CORAL™ or BLACK DIAMOND™.

According to an embodiment of the present invention, the material of the second dielectric layer can be, for example, a porous material, silicon low-k (SILK™) or a porous SILK™.

According to an embodiment of the present invention, the material of the cap layer can be, for example, a dielectric material, silicon oxide, silicon oxynitride, or silicon carbide.

According to an embodiment of the present invention, the material of the metal-containing hard mask layer can be, for example, titanium nitride, tantalum nitride or tungsten.

According to an embodiment of the present invention, the material of the dielectric hard mask layer can be, for example, silicon oxide, silicon nitride, or silicon carbide.

The present invention uses a stacked structure and method to integrate the low dielectric constant material layer, such as SILK™, and the low dielectric constant material layer, such as CORAL™. As a result, the impact from the thermal stress in the conventional technology is reduced. In addition, the process is simplified and the manufacturing costs are reduced.

The above and other features of the present invention will be better understood from the following detailed description of the preferred embodiments of the invention that is provided in communication with the accompanying drawings.

DESCRIPTION OF SOME EMBODIMENTS

Figure 1A:
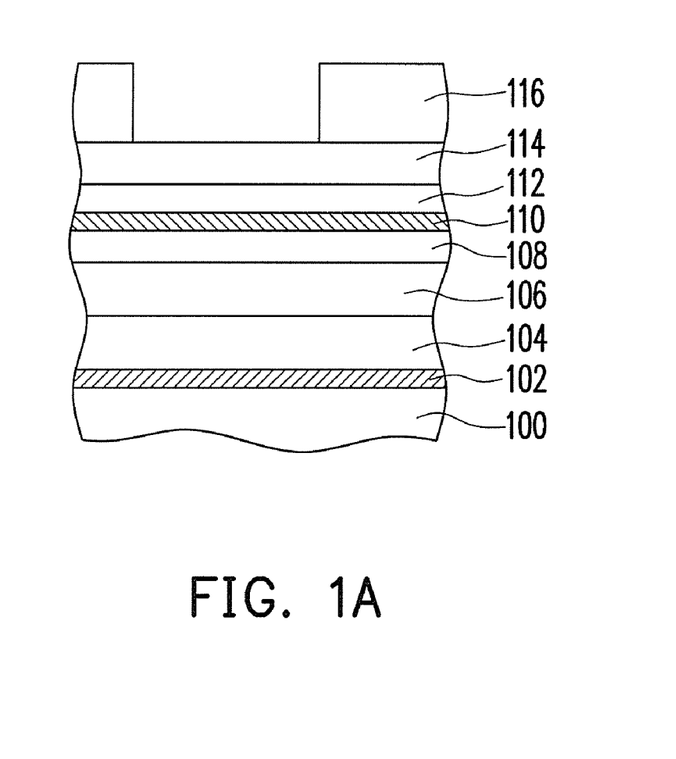
FIGS. 1A-1I are schematic cross-sectional views showing progress of a manufacturing method of a dual damascene structure according to an embodiment of the present invention.

FIGS. 1A-1I are schematic cross-sectional views showing progress of a manufacturing method of a dual damascene structure according to an embodiment of the present invention. Referring to FIG. 1A, a barrier layer 102 is formed over the substrate 100. Wherein, the material of the barrier layer 102 can be, for example, silicon nitride, silicon carbide or silicon carbonitirde. Then, a first dielectric layer 104, a second dielectric layer 106, a cap layer 108, a metal-containing hard mask layer 110, a dielectric hard mask layer 112, a first bottom anti-reflection layer 114 and a first photoresist layer (not shown) are sequentially formed over the barrier layer 102. The material of the first dielectric layer 104 can be, for example, CORAL™ or BLACK DIAMOND™. The material of the second dielectric layer 106 can be, for example, anyone of a porous material, SILK™, or porous SILK™. The material of the cap layer 108 can be, for example, anyone of a dielectric material, silicon oxide, silicon oxynitride, or silicon carbide. The material of the metal-containing hard mask layer 110 can be, for example, anyone of titanium nitride, tantalum nitride or tungsten. The material of the dielectric hard mask layer 112 can be, for example, silicon oxide, silicon nitride, or silicon carbide. In an embodiment of the present invention, the dielectric constant of the first dielectric layer 104, for example, is higher than that of the second dielectric layer 106, or the hardness of the first dielectric layer 104, for example, is higher than that of the second dielectric layer 106. The first photoresist layer is patterned to obtain the patterned first photoresist layer 116.

Figure 1B:
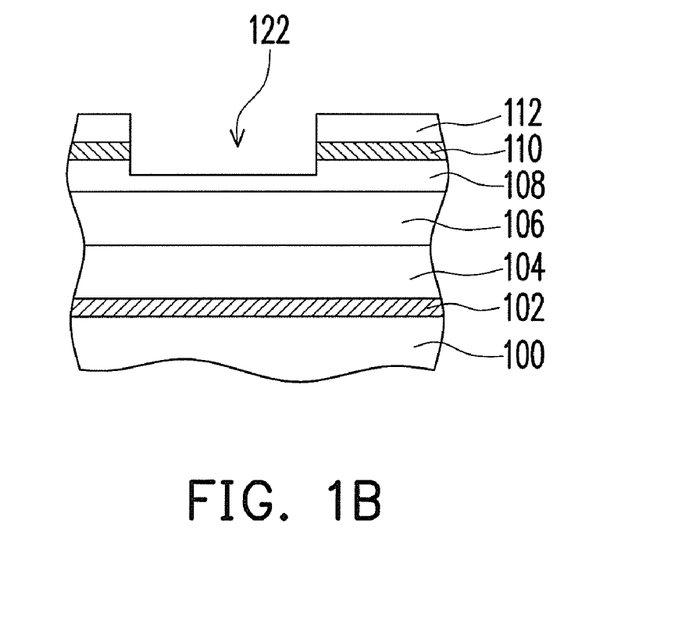

Referring to FIG. 1B, the patterned first photoresist layer 116 is used as a mask to etch the first anti-reflection coating layer 114, the dielectric hard mask layer 112, the metal-containing hard mask layer 110 and the cap layer 108 to obtain the first trench structure 122. Wherein, the bottom of the first trench structure 122 exposes the surface of the cap layer 108. The patterned first photoresist layer 116 and the first bottom anti-reflection coating layer 114 are removed.

Figure 1C:
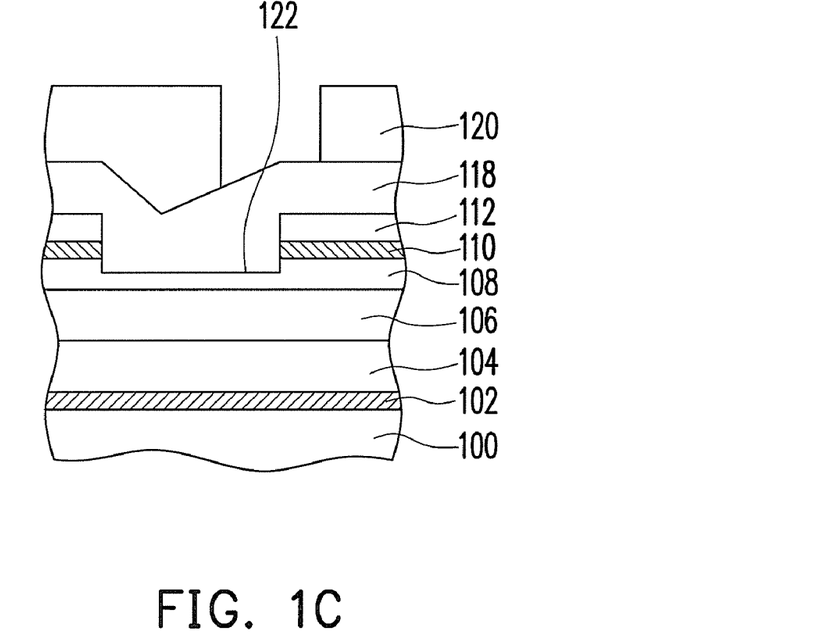

Referring to FIG. 1C, a second bottom anti-reflection coating layer 118 is formed to fill the first trench structure 122 and to cover a surface of the dielectric hard mask layer 112. A second photoresist layer (not shown) is then formed over the second bottom anti-reflection coating layer 118. The second photoresist layer is patterned to obtain a patterned second photoresist layer 120.

Figure 1D:
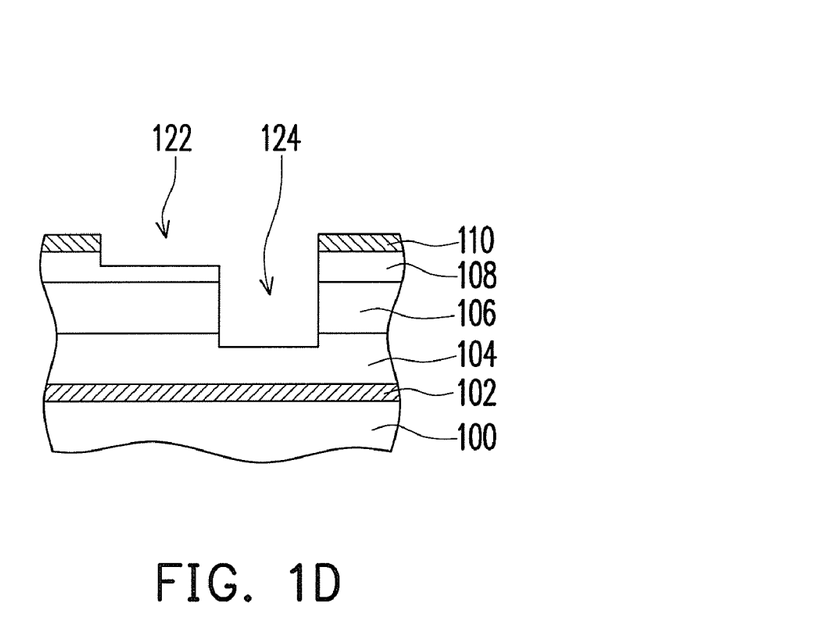

Referring to FIG. 1D, the second bottom anti-reflection coating layer 118, the dielectric hard mask layer 112, the metal-containing hard mask layer 110, the cap layer 108, the second dielectric layer 106 and the first dielectric layer 104 are etched by using the patterned second photoresist layer 120 as a mask layer to obtain a first via structure 124. Wherein, a bottom of the first via structure 124 exposes a surface of the first dielectric layer 104. The patterned second photoresist layer 120, the second bottom anti-reflection coating layer 118 and the dielectric hard mask layer 112 are removed.

Figure 1E:
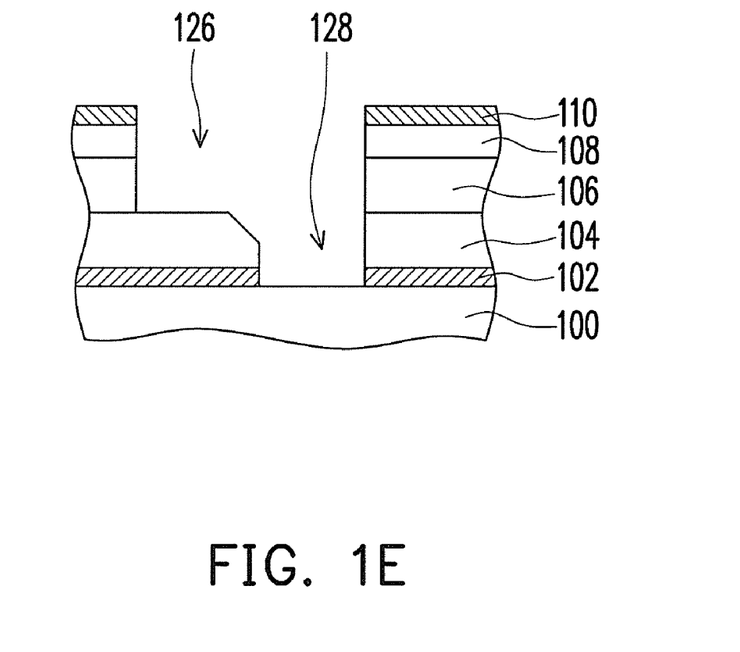

Referring to FIG. 1E, the first trench structure 122 and the first via structure 124 are etched to obtain a second trench structure 126 and a second via structure 128. Wherein, a bottom of the second via structure 128 exposes a surface of the substrate 100, and a bottom of the second trench structure 126 exposes a surface of the first dielectric layer 104. In an embodiment of the present invention, a dry etch process with nitrogen, octafluorocyclobutane ($C_4F_8$), oxygen, and argon is used to perform the etch process, for example. Accordingly, the surface of the second trench structure 126 adjacent to the second via structure 128 is inclined.

Figure 1F:
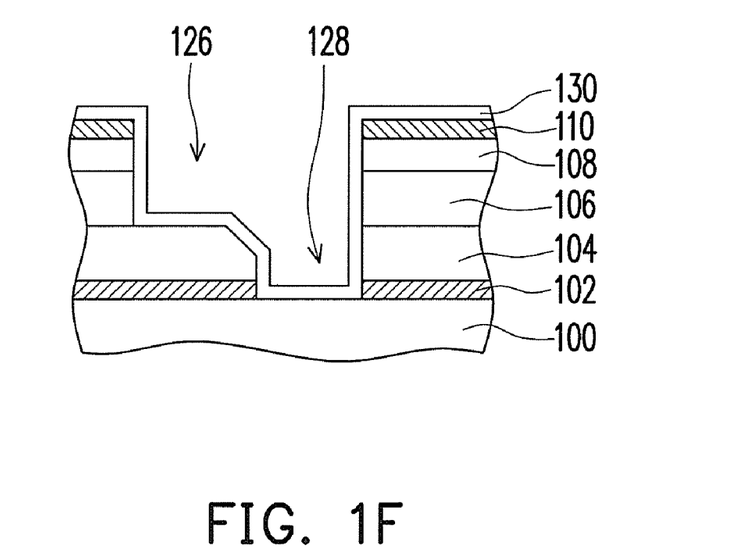

Referring to FIG. 1F, in an embodiment of the present invention, the method further comprises forming a liner layer 130 to cover the surface of the second trench structure 126, the surface of the second via structure 128 and the surface of the metal-containing hard mask layer 110. Wherein, the material of the liner layer 130 can be, for example, tantalum or tantalum nitride.

Figure 1G:
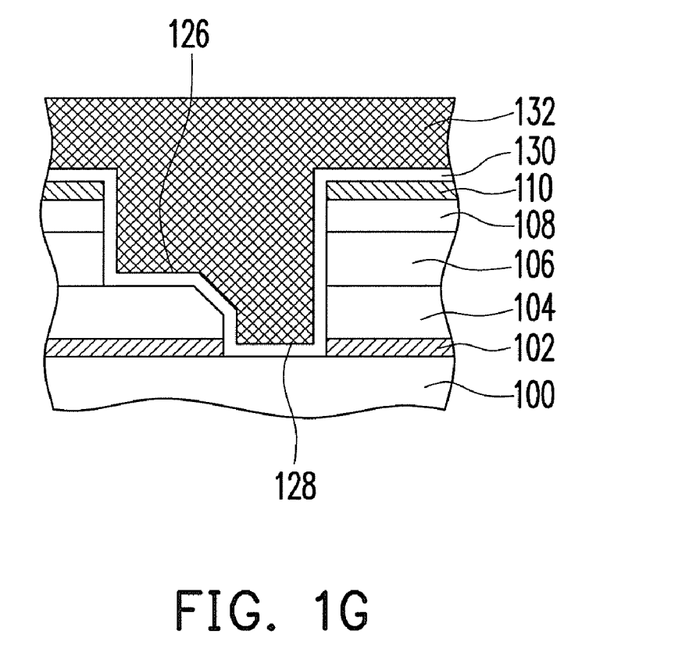

Referring to FIG. 1G, the method further comprises forming a metal layer 132 over the liner layer 130, for example. Wherein, the material of the metal layer 132 can be, for example, copper.

Figure 1H:
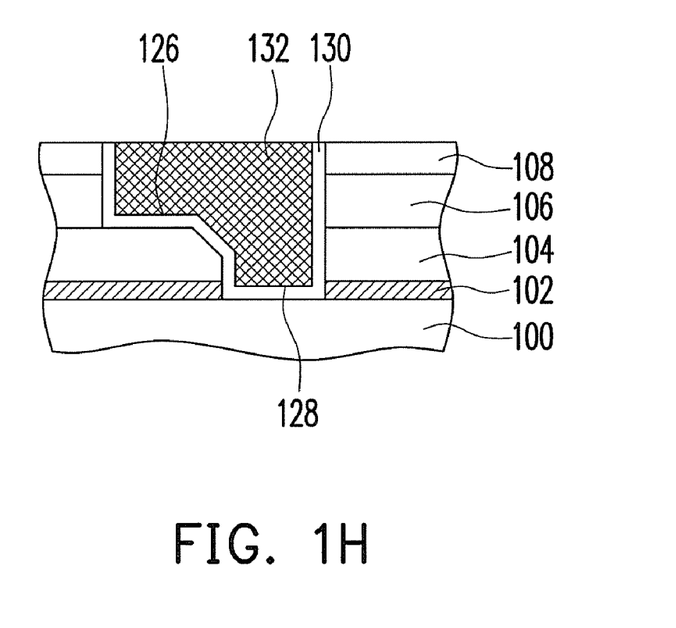
Figure 1I:
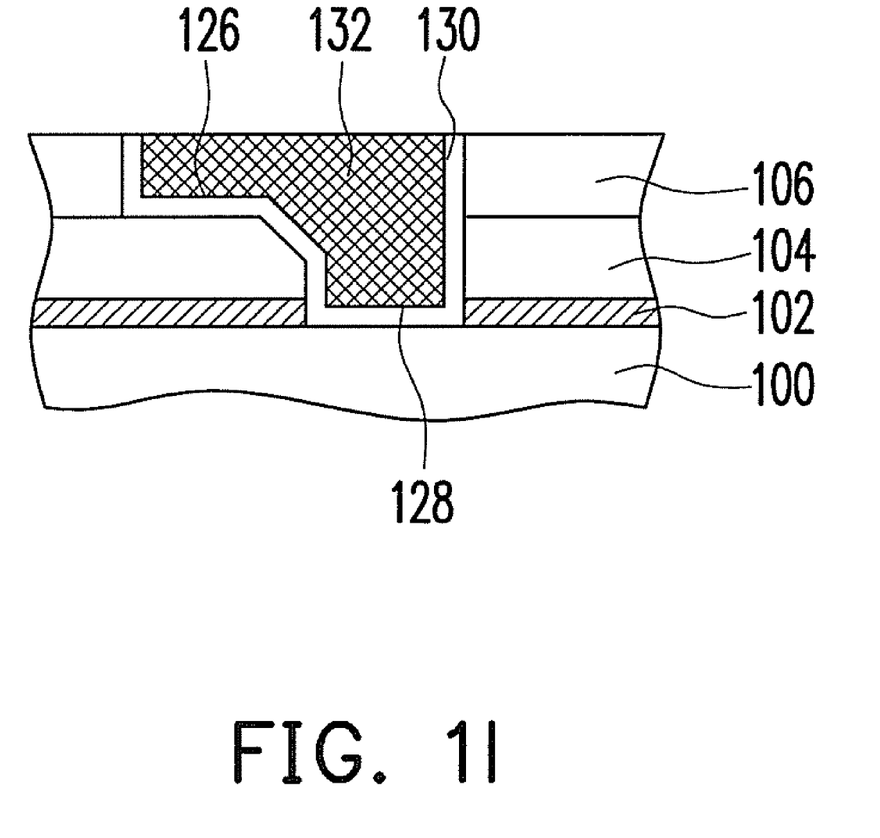

In addition to the method described above, the method of the present invention may further comprise the following steps. Referring to FIG. 1H, in an embodiment of the present invention, the method further comprises planarizing the surface of the dual damascene structure until exposing the surface of the cap layer 108, for example. Referring to 1I, in other embodiments, the method further comprises planarizing the surface of the dual damascene structure until exposing the surface of the second dielectric layer 106, for example.

FIGS. 2A-2D are schematic cross-sectional views showing progression of a manufacturing method of a dual damascene structure according to another embodiment of the present invention. The manufacturing method of the dual damascene structure according to this embodiment is similar to that according to the embodiment in FIGS. 1A-1I. The difference is that the cap layer is omitted in this embodiment. The materials of the layers in this embodiment are similar to those in FIGS. 1A-1I. Detailed descriptions are not repeated.

Figure 2A:
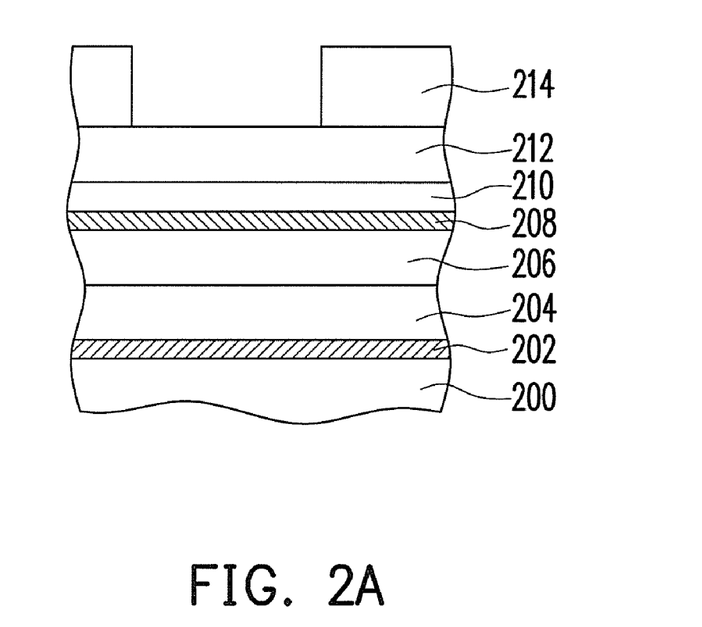
FIGS. 2A-2D are schematic cross-sectional views showing progression of a manufacturing method of a dual damascene structure according to another embodiment of the present invention.

Referring to FIG. 2A, a barrier layer 202, a first dielectric layer 204, a second dielectric layer 206, a metal-containing hard mask layer 208, a dielectric hard mask layer 210, a first bottom anti-reflection coating layer 212, and a first photoresist layer (not shown) are sequentially formed over a substrate 200. Wherein, the dielectric constant of the first dielectric layer 204, for example, is higher than that of the second dielectric layer 206, and the hardness of the first dielectric layer 204, for example, is higher than that of the second dielectric layer 206. The first photoresist layer is patterned to obtain the patterned first photoresist layer 214.

Figure 2B:
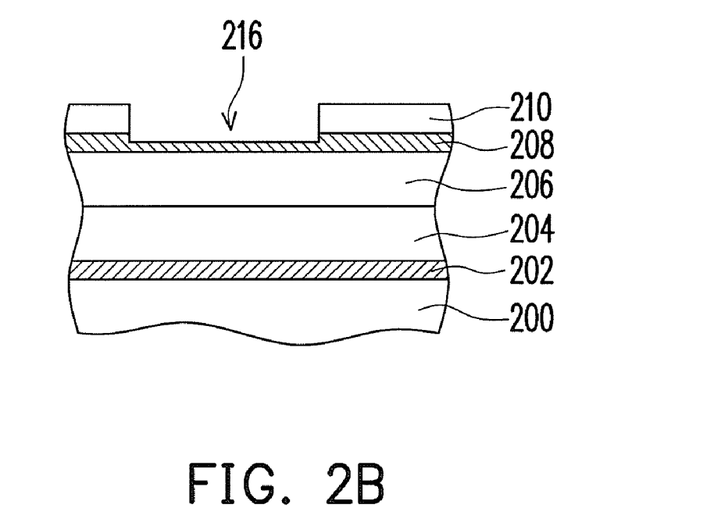

Referring to FIG. 2B, the first bottom anti-reflection coating layer 212, the dielectric hard mask layer 210 and the metal-containing hard mask layer 208 are etched by using the patterned first photoresist layer 214 as a mask layer to obtain a first trench structure 216. Wherein, a bottom of the first trench structure 216 exposes a surface of the metal-containing hard mask layer 208. The patterned first photoresist layer 214 and the first bottom anti-reflection coating layer 212 are removed.

Figure 2C:
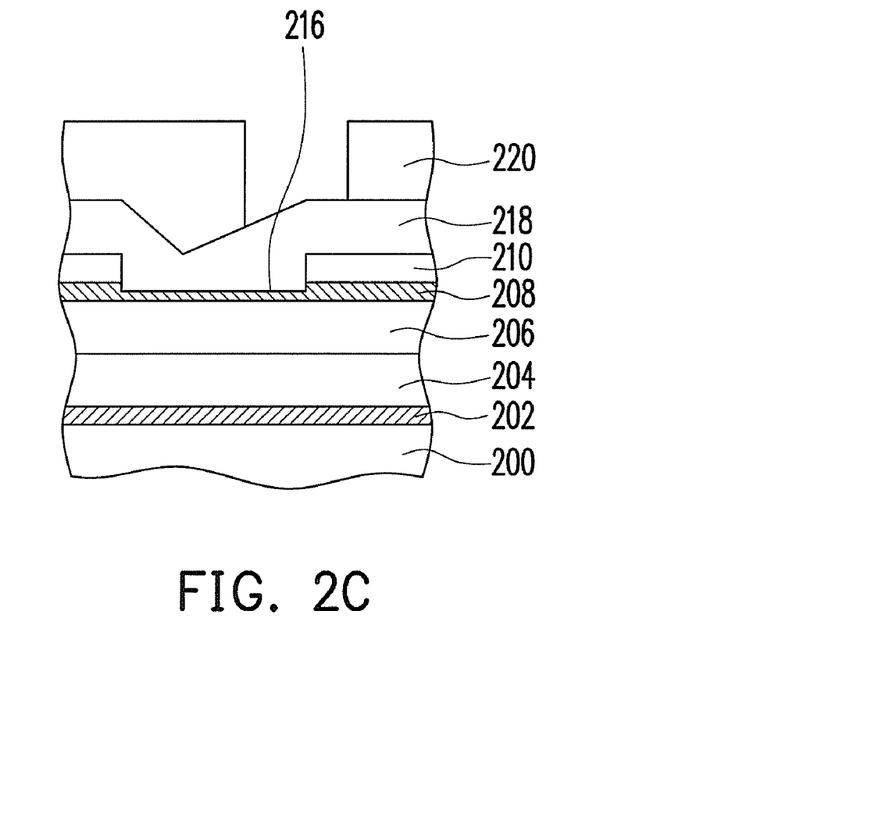

Referring to FIG. 2C, a second bottom anti-reflection coating layer 218 is formed to fill the first trench structure 216 and to cover a surface of the dielectric hard mask layer 210. A second photoresist layer (not shown) is formed over the second bottom anti-reflection coating layer 218. The second photoresist layer is patterned to obtain a patterned second photoresist layer 220.

Figure 2D:
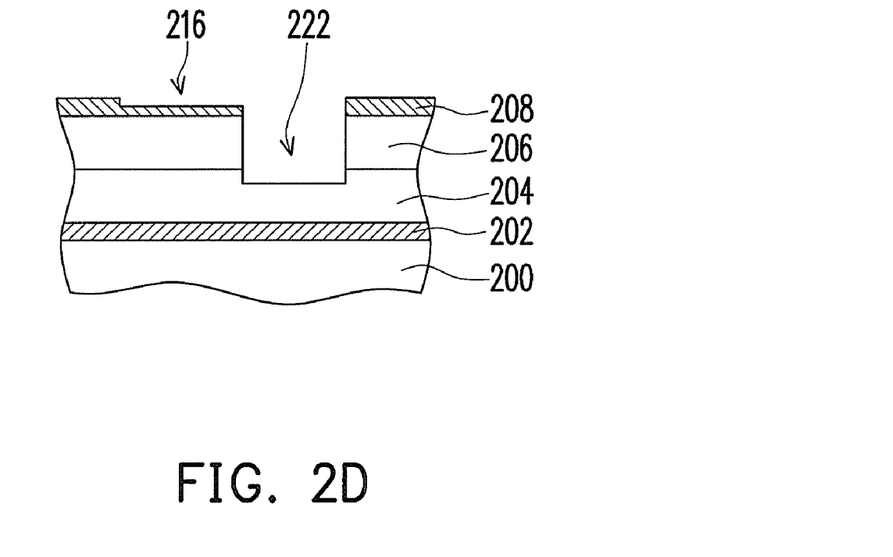

Referring to FIG. 2D, the second bottom anti-reflection coating layer 218, the dielectric hard mask layer 210, the metal-containing hard mask layer 208, the second dielectric layer 206 and the first dielectric layer 204 are etched by using the patterned second photoresist layer 220 as a mask layer to obtain a first via structure 222. Wherein, a bottom of the first via structure 222 exposes a surface of the first dielectric layer 204. The patterned second photoresist layer 220, the second bottom anti-reflection coating layer 218 and the dielectric hard mask layer 210 are removed. Then, the etch process identical or similar to the step in FIG. 1E is used to obtain the second trench structure and the second via structure.

The present invention also provides still another manufacturing method of a dual damascene structure similar to that described in FIGS. 1A-1E. The only difference is that the step of forming the dielectric hard mask layer is omitted in this embodiment. The materials of the layers and the manufacturing method of the damascene structure in this embodiment are similar to those in FIGS. 1A-1I. Detailed descriptions are not repeated.

The present invention also provides yet another manufacturing method of a dual damascene structure which is similar to that described in FIGS. 2A-2D. The only difference is that the steps of forming the cap layer and the dielectric hard mask layer are omitted. The materials of the layers and the manufacturing method of the damascene structure in this embodiment are similar to those in FIGS. 2A-2D. Detailed descriptions are not repeated. Then, the etch process identical or similar to the step in FIG. 1E is used to obtain the second trench structure and the second via structure.

Note that in these three embodiments described above, the steps described in FIGS. 1F-1I can be performed to form the liner layer, fill the metal layer, and planarize the surface of the dual damascene structure. Accordingly, the dual damascene structure is accomplished.

Accordingly, the manufacturing method of the dual damascene structure in the present invention has at least the following advantages: The present invention uses low dielectric constant materials as dielectric layers and integrates these low dielectric constant material layers in a stack. As a result, the impact from thermal stress in the conventional technology can be reduced, and the process can be simplified. Accordingly, the simplified process for manufacturing the dual damascene structure can reduce the manufacturing costs.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A manufacturing method of a dual damascene structure, comprising:
    forming a first dielectric layer over a substrate;
    forming a second dielectric layer directly on the first dielectric layer;
    forming a mask layer over the second dielectric layer;
    forming a first trench structure in the mask layer without penetrating through the mask layer;
    forming a first via structure in the mask layer, the second dielectric layer and the first dielectric layer, wherein the first via structure is formed without penetrating through the first dielectric layer; and
    removing a portion of the second dielectric layer and a portion of the first dielectric layer so as to transform the first trench structure and the first via structure into a second trench structure and a second via structure at the same time, wherein a bottom of the second trench structure exposes the first dielectric layer and the second via structure penetrating through the first dielectric layer.

2. The manufacturing method of a dual damascene structure of claim 1, wherein a dielectric constant of the first dielectric layer is higher than a dielectric constant of the second dielectric layer.

3. The manufacturing method of a dual damascene structure of claim 1, wherein a hardness of the first dielectric layer is higher than a hardness of the second dielectric layer.

4. The manufacturing method of a dual damascene structure of claim 1, further comprising:
    forming a barrier layer under the first dielectric layer.

5. The manufacturing method of a dual damascene structure of claim 4, wherein a material of the barrier layer comprises silicon nitride, silicon carbide, or silicon carbonitride.

6. The manufacturing method of a dual damascene structure of claim 1, wherein a material of the second dielectric layer comprises a porous material.

7. The manufacturing method of a dual damascene structure of claim 6, wherein a material of the metal-containing hard mask layer comprises titanium nitride, tantalum nitride or tungsten.

8. The manufacturing method of a dual damascene structure of claim 1, wherein the mask layer is a metal-containing hard mask layer.

9. The manufacturing method of a dual damascene structure of claim 1, wherein the mask layer comprises a cap layer, a metal-containing hard mask layer and a dielectric hard mask layer.

10. The manufacturing method of a dual damascene structure of claim 1, wherein the mask layer comprises a cap layer and a metal-containing hard mask layer.

11. The manufacturing method of a dual damascene structure of claim 1, further comprising:
    forming a liner layer covering a surface of the second trench structure, a surface of the second via structure and a surface of the mask layer; and
    forming a metal layer over the liner layer.

12. The manufacturing method of a dual damascene structure of claim 11, wherein the liner layer comprises tantalum or tantalum nitride and the metal layer comprises copper.

13. The manufacturing method of a dual damascene structure of claim 11, further comprising:
    planarizing a surface of the dual damascene structure until exposing the mask layer.

14. The manufacturing method of a dual damascene structure of claim 11, further comprising:
    planarizing a surface of the dual damascene structure until exposing the second dielectric layer.

* * * * *